United States Patent
Robert

(10) Patent No.: US 10,822,227 B2
(45) Date of Patent: Nov. 3, 2020

(54) PRESSURE SENSOR, IN PARTICULAR A MICROPHONE WITH IMPROVED LAYOUT

(71) Applicant: COMMISSARIAT A L'ENERGIE ATOMIQUE ET AUX ENERGIES ALTERNATIVES, Paris (FR)

(72) Inventor: Philippe Robert, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/335,740

(22) PCT Filed: Oct. 3, 2017

(86) PCT No.: PCT/FR2017/052709
§ 371 (c)(1),
(2) Date: Mar. 22, 2019

(87) PCT Pub. No.: WO2018/065717
PCT Pub. Date: Apr. 12, 2018

(65) Prior Publication Data
US 2019/0233278 A1 Aug. 1, 2019

(30) Foreign Application Priority Data
Oct. 5, 2016 (FR) .................................. 16 59623

(51) Int. Cl.
*B81B 7/02* (2006.01)
*B81C 1/00* (2006.01)
(Continued)

(52) U.S. Cl.
CPC .............. *B81B 7/02* (2013.01); *B81B 7/0061* (2013.01); *B81C 1/00047* (2013.01);
(Continued)

(58) Field of Classification Search
CPC ...... H04R 17/00; H04R 17/005; H04R 17/02; H04R 17/025; H04R 17/04; H04R 17/06; H04R 17/08; H04R 17/10
See application file for complete search history.

(56) References Cited

U.S. PATENT DOCUMENTS

| 4,939,497 A | 7/1990 | Nishida et al. |
| 6,522,762 B1 | 2/2003 | Mullenborn et al. |

(Continued)

OTHER PUBLICATIONS

Written Opinion of International Searching Authority, European Patent Office, dated Feb. 1, 2018, all pages. (Year: 2018).*

(Continued)

*Primary Examiner* — Victoria K. Hall
(74) *Attorney, Agent, or Firm* — Oblon, McClelland, Maier & Neustadt, L.L.P.

(57) ABSTRACT

An electromechanical pressure sensor system, in particular microphone type, including an electromechanical transducer, signal processing device, a substrate for receiving at least one support of the electromechanical transducer and/or signal processing device, a protective cover arranged on the upper face of the substrate, the support of the electromechanical transducer and/or signal processing device being housed in at least one cavity located on the lower face of the substrate is disclosed.

17 Claims, 5 Drawing Sheets

(51) Int. Cl.
*H04R 17/00* (2006.01)
*B81B 7/00* (2006.01)
*H01L 23/00* (2006.01)
*H04R 19/00* (2006.01)
*H04R 19/04* (2006.01)
*H01L 23/13* (2006.01)

(52) U.S. Cl.
CPC .............. *H01L 24/16* (2013.01); *H01L 24/48* (2013.01); *H01L 24/73* (2013.01); *H01L 24/92* (2013.01); *H04R 19/005* (2013.01); *H04R 19/04* (2013.01); *B81B 2201/0257* (2013.01); *B81B 2201/0264* (2013.01); *B81B 2203/0127* (2013.01); *B81B 2203/0315* (2013.01); *B81B 2203/0353* (2013.01); *B81B 2207/012* (2013.01); *B81B 2207/096* (2013.01); *H01L 23/13* (2013.01); *H01L 24/32* (2013.01); *H01L 2224/13101* (2013.01); *H01L 2224/16225* (2013.01); *H01L 2224/32145* (2013.01); *H01L 2224/4824* (2013.01); *H01L 2224/48091* (2013.01); *H01L 2224/48137* (2013.01); *H01L 2224/73215* (2013.01); *H01L 2224/73257* (2013.01); *H01L 2224/92147* (2013.01); *H01L 2924/00014* (2013.01); *H01L 2924/10155* (2013.01); *H01L 2924/10158* (2013.01); *H01L 2924/1433* (2013.01); *H01L 2924/1461* (2013.01); *H01L 2924/15151* (2013.01); *H01L 2924/15153* (2013.01); *H01L 2924/15159* (2013.01); *H01L 2924/15192* (2013.01); *H01L 2924/15321* (2013.01); *H01L 2924/16151* (2013.01); *H01L 2924/16152* (2013.01)

(56) References Cited

U.S. PATENT DOCUMENTS

| | | | | |
|---|---|---|---|---|
| 6,870,938 B2* | 3/2005 | Takeuchi | ................ | H04R 1/04 381/113 |
| 8,902,604 B2* | 12/2014 | Zoellin | ................ | H04R 19/005 361/761 |
| 9,264,815 B2* | 2/2016 | Wang | ................ | H04R 19/04 |
| 9,319,772 B2* | 4/2016 | Chen | ................ | H04R 1/28 |
| 9,351,084 B2* | 5/2016 | Gao | ................ | H04R 19/005 |
| 10,291,973 B2* | 5/2019 | Lim | ................ | H04R 1/086 |
| 2003/0128854 A1 | 7/2003 | Mullenborn et al. | | |
| 2006/0115102 A1 | 6/2006 | Mullenborn et al. | | |
| 2007/0286437 A1 | 12/2007 | Mullenborn et al. | | |
| 2008/0049955 A1* | 2/2008 | Fujiwara | ................ | H04R 17/00 381/190 |
| 2008/0310663 A1* | 12/2008 | Shirasaka | ............ | H04R 19/016 381/355 |
| 2008/0315333 A1* | 12/2008 | Combi | ................ | B81B 7/02 257/415 |
| 2009/0080682 A1* | 3/2009 | Ogura | ................ | B81B 7/0061 381/355 |
| 2009/0257614 A1* | 10/2009 | Mei | ................ | H04R 19/04 381/355 |
| 2010/0303271 A1* | 12/2010 | Wang | ................ | H04R 19/005 381/355 |
| 2011/0293126 A1* | 12/2011 | Maekawa | ............ | H04R 19/005 381/355 |
| 2012/0001275 A1* | 1/2012 | Chi | ................ | B81C 1/00309 257/415 |
| 2012/0212925 A1* | 8/2012 | Zoellin | ................ | H04R 19/005 361/807 |
| 2015/0156575 A1* | 6/2015 | Kim | ................ | H04R 17/02 381/355 |
| 2015/0189443 A1* | 7/2015 | Wang | ................ | H04R 19/005 381/173 |
| 2015/0189446 A1* | 7/2015 | Wang | ................ | H04R 19/04 381/174 |
| 2015/0365751 A1 | 12/2015 | Schelling et al. | | |
| 2016/0014530 A1* | 1/2016 | Gao | ................ | H04R 19/005 257/416 |
| 2017/0374474 A1* | 12/2017 | Hoekstra | ............ | H04R 19/005 |
| 2019/0077654 A1* | 3/2019 | Reagan | ................ | H04R 3/005 |
| 2019/0343492 A1* | 11/2019 | Miyazawa | ............ | A61B 8/4427 |

OTHER PUBLICATIONS

International Search Report dated Feb. 1, 2018 in PCT/FR2017/052709 filed Oct. 3, 2017.

French Preliminary Search Report dated Jul. 12, 2017 in Patent Application No. 1659623 filed Oct. 5, 2016.

* cited by examiner

PRESSURE SENSOR, IN PARTICULAR A MICROPHONE WITH IMPROVED LAYOUT

TECHNICAL FIELD AND PRIOR ART

The present application relates to the field of electromechanical systems, and more particularly to that of pressure sensor systems and advantageously microphones provided with at least one MEMS ("microelectromechanical systems") and/or NEMS ("nano-electromechanical systems") electromechanical component.

The MEMS and/or NEMS component of a pressure sensor and in particular of a microphone includes a sensitive element, typically in the form of an oscillating membrane, deforming under the effect of a pressure differential between both its faces. The membrane generally deforms in an off-plane direction, i.e. perpendicularly to the main plane of the electromechanical component. In a microphone type pressure sensor, an initiation of movement caused by an input sound wave translates into an electric signal, for example a signal due to a capacitance change between a fixed electrode and a movable electrode attached to the membrane or formed by the membrane.

The electromechanical component is generally associated and connected with an electronic component such as a chip or an ASIC ("Application-Specific Integrated Circuit") provided with means for processing signals from the electromechanical component. The electronic component and the electromechanical component are typically disposed on an assembling substrate and placed in an enclosure formed by the assembling substrate and a protective cap. The assembling substrate can include connections and be caused to be transferred to an electronic board.

For cost and bulk reasons, it is attempted to make the pressure sensors or microphones less and less bulky.

Additionally, an important factor in the performance of such systems is the volume of the rear chamber which designates the volume in the enclosure located behind or on the side of the rear face of the membrane, that is on the side of the face opposite to that, called the front face, against which a sound wave penetrating through the input port arrives first. This volume of the rear chamber or "rear volume" represents a compensation volume when the membrane oscillates. It is generally attempted to maximise this rear volume in order to increase the performance of the microphone in particular in terms of signal to noise ratio and low frequency response. It is generally attempted in the meantime to minimise another volume of the system, called the "front chamber volume" or "front volume" and located opposite to the rear volume with respect to the sensitive element.

Document U.S. Pat. No. 9,264,815 B2 provides a microphone forming system in which, to reduce bulk, an ASIC is disposed in a cavity located on the side of the upper face of an assembling substrate whereas the electromechanical component is disposed above the ASIC. In such a system, the input port for acoustic waves is an aperture provided in a cap, this cap being disposed on the upper face of the substrate. Because of the presence of the ASIC in the cavity, such a system has a reduced rear chamber volume, which can be detrimental to its performance.

In document US 2015/0189443 A1, an alternative solution to the bulk problem, consists in placing the electromechanical component in a cavity located on the side of the upper face of the assembling substrate, whereas the ASIC is stacked on the electromechanical component. In such a system, the input port for the acoustic waves is therefore an aperture provided at the lower face of the substrate and which communicates with the cavity, the front chamber volume, which can cause spurious resonance remains relatively important. In addition, because of the presence of the ASIC in the rear chamber, such a system has a reduced rear chamber volume, which can also be detrimental to its performance. Additionally, such a system is not adapted to a configuration in which the cap acts as an input port for acoustic waves.

There is the problem to find a new pressure sensor structure improved with respect to the abovementioned drawback(s) and in particular with an increased rear chamber volume for a given pressure sensor volume.

DISCLOSURE OF THE INVENTION

One embodiment of the present invention provides a pressure sensor electromechanical system including:
 an electromechanical transducer provided with a sensitive element able to move under the effect of a pressure difference between its faces,
 signal processing means, for processing signals resulting from a movement of the sensitive element,
 a substrate for accommodating at least one support of the electromechanical transducer and/or signal processing means, the substrate having an upper face and a lower face opposite to the upper face, the lower face being provided with at least one conducting zone able to be connected with an electronic board the substrate further including an aperture passing through its thickness, the aperture comprising a first hole opening at the upper face of the substrate and in the extension of the first hole, a first cavity opening at the lower face of the substrate, the first cavity having a width higher than that of the first hole so as to form a shoulder, the support of the electromechanical transducer and/or of the signal processing means being housed in the first cavity such that a region of a front face of the support bears against a bearing zone of the shoulder.

In the case where the transducer is integrated to said support, the first cavity can form an input port for acoustic waves.

In another case where the signal processing means are integrated to said support and where the electromechanical transducer is integrated to another support disposed on the upper face of the substrate, the arrangement of the system can be such that the first hole is sealed by said support, whereas the cap includes an aperture forming an input port for acoustic waves. Advantageously, a second hole distinct from the first hole is in the extension of the first cavity. The support can therefore be connected to the substrate through a conducting wire passing through the second hole.

According to another aspect, the present invention relates in particular to a pressure sensor electromechanical system including:
 a first structure including an electromechanical transducer provided with a sensitive element able to be moved under the effect of a pressure difference between its faces,
 a second structure including signal processing means, for processing the signals resulting from a movement of the sensitive element,
 a substrate for accommodating the first and second structures, the substrate including an upper face and a lower face opposite to the upper face, the first structure and the second structure being disposed in one or more cavity(ies) formed in the substrate and opening into at least one of the faces of the substrate, the lower face being provided with at least one connection conducting zone, a first cavity among said cavities in which the first structure is disposed opening into the lower face of the substrate, said first cavity communicating with a first hole passing through the substrate between said first cavity and the upper face of the substrate, the cavity having a width higher than that of said first hole so as to form a shoulder, a front face of the first structure bearing against a bearing zone of the shoulder.

Such a shoulder can enable the assembly between the substrate and the first structure which can be parts made independently from each other, to be facilitated.

Such a system can form a microphone or be integrated to a microphone. Such an arrangement of the support allows a compactness gain.

The electromechanical system can be provided with a protective cap arranged on the upper face of the substrate.

The bearing zone of the shoulder is in particular a zone in a plane located at the interface or at the boundary between the first cavity and the first hole. An arrangement on such a zone enables the first structure to be robustly held.

According to a possible implementation, the system can comprise a connection structure between the conducting zone located on the lower face of the substrate and a conducting zone of a support of the first structure, the connection structure comprising at least one conducting element passing through the substrate. Such an arrangement of the connection structure also allows a compactness gain of the system.

According to one embodiment, the connection structure comprises a conducting wire passing through the first hole connecting a conducting zone located on the upper face of the substrate and a conducting zone of the support of the first structure.

According to another embodiment of the connection structure, the conducting element passes through the substrate and has a curved shape, the conducting element being arranged so as to connect the bearing zone of the shoulder and said conducting zone located on the lower face of the substrate. Such an arrangement makes it possible for the connection structure not to take too much space in a working volume of an enclosure located between the cap and the substrate.

According to one possible implementation, the electromechanical transducer is integrated to a support and the sensitive element is disposed on the side of the front face of this support. Such an arrangement of the sensitive element with respect to the shoulder permits to have a rear chamber with an important volume.

According to a possible arrangement of the signal processing means, these can be integrated to the same support as the transducer.

According to another possible arrangement, the electromechanical transducer is integrated to a first support, the signal processing means are integrated to a second support distinct from the first support.

In this case, the second support can be advantageously disposed in a second cavity opening at the lower face of the substrate, the second cavity communicating with a second hole, the second hole having a width lower than that of the second cavity and opening at the upper face of the substrate. With such an arrangement, the bulk is further reduced while affording to obtain a more important rear chamber volume.

Alternatively, the signal processing means are integrated to a second support disposed in another cavity distinct from the first cavity, this other cavity opening at the upper face of the substrate. Such an arrangement allows a compactness gain and is adapted to a configuration in which the input port of the acoustic waves is located at the cap.

When the transducer is integrated to a first support and the signal processing means are integrated to a second support, the first support can be connected to a front face of the second support through a conducting wire passing through the first hole. The second support can be connected to the substrate through another conducting wire.

The second support can be provided with one or more through conducting elements to make it possible to establish a connection between its front face and its rear face. In this case, the conducting wire connecting the first support and the second support and/or the other conducting wire connecting the second support to the substrate can be respectively connected to a conducting element passing through the second support.

BRIEF DESCRIPTION OF THE DRAWINGS

The present invention will be better understood upon reading the description of exemplary embodiments given, by way of purely indicating and in no way limiting purposes, in reference to the appended drawings in which.

Identical, similar or equivalent parts of the different figures bear the same reference numerals so as to facilitate switching from one figure to the other.

The different parts represented in the figures are not necessarily drawn to a uniform scale, to make the figures more readable.

Further, in the description hereinafter, terms which depend on the orientation of the structure such as for example "upper", "lower", "under", "on", are applied considering that the structure is oriented in the illustrated way in the figures.

DETAILED DISCLOSURE OF PARTICULAR EMBODIMENTS

Figure 1:
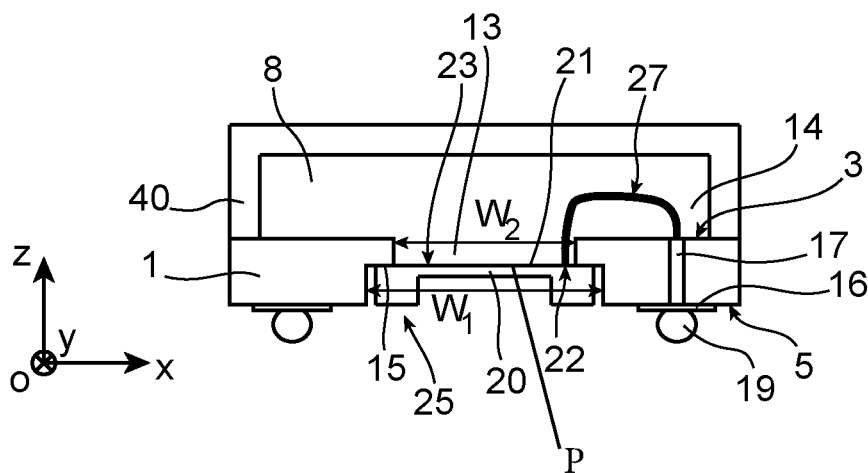
FIG. 1 illustrates an example of an electromechanical system forming a microphone with an improved arrangement in which a MEMS and/or NEMS electromechanical component is housed in a cavity located on the lower face of an assembling substrate.

One example of an electromechanical system forming a microphone for converting pressure variations into electric signal variations is illustrated in FIG. 1.

The electromechanical system comprises an assembling substrate 1 which can be based on polymeric material(s) possibly filled with or based on a ceramic material or a semiconductor material such as silicon. The thickness of the substrate 1 (dimension measured in a direction orthogonal to the main plane of the substrate 1 and in parallel with the axis z of the orthogonal reference frame [O;x;y;z]) can be between 100 µm and 700 µm. By "main plane", it is meant a plane passing through the substrate and parallel to the plane [O;x;y].

At one of its faces called a "lower face" 5, the assembling substrate 1 includes a recess 12 or a cavity 12, in the extension of which a hole 13 opening at an upper face 3 of the substrate 1 is provided, that is the face opposite to the lower face 5. The cavity 12 is provided with a width $W_1$ greater than that $W_2$ of the hole 13 so as to form a shoulder. The widths $W_1$ and $W_2$ are dimensions measured in parallel to the main plane of the substrate 1, in other words to the plane [O;x;v].

A MEMS and/or NEMS electromechanical component 20 is disposed in the cavity 12. The MEMS and/or NEMS type electromechanical component 20 housed in the cavity 12 is in the form of a support, for example of silicon, and is provided with a sensitive element such as a membrane 21 able to vibrate under the effect of acoustic waves. The membrane 21 is located on the side of a face of the support called a "front face" 23. A peripheral region of the front face 23 and which is located about the membrane 21 bears against a zone 15 called a "bearing zone" of the substrate 1 located at the bottom of the cavity 12 and forming a step or a shoulder. This bearing zone 15 is located in a plane P located at the interface between the hole 13 and the cavity 12. The bearing zone 15 makes a non-zero angle with a normal to the main plane of the substrate 1. In the particular example illustrated in FIG. 1, the bearing zone 15 is parallel to the main plane of the substrate 1. This bearing zone 15 enables assembly between the electromechanical component 20 which can be made in particular by adhering and/or soldering and/or welding, to be facilitated. Such a configuration type makes it possible to foresee to make the accommodating substrate 1 and the electromechanical component independently of each other and then to assemble them subsequently. This bearing zone also enables the electromechanical component 20 to be robustly held on the accommodating substrate.

In this exemplary embodiment, the cavity 12 acts as an input port for acoustic waves enabling the membrane 21 to be vibrated. The acoustic waves thus penetrate through the rear face 25 of the electromechanical component 20, that is the face of the electromechanical component 20 opposite to the front face 23.

The cavity 12 and the hole 13 in its extension thus form an aperture passing through the thickness of the substrate 1 and which is at least partially sealed by the membrane 21 of the electromechanical component 20. In the extension of the hole 13, a volume located on the side of the front face of the electromechanical component 20 and of the substrate 1 and delimited by a cap 40, forms the rear chamber of the pressure sensor system. The cap 40 can be for example of metal, or ceramic, or plastic material, or a semiconductor such as silicon and disposed at the front face 3 of the substrate 1 so as to make a protective enclosure 8, the cap being preferably closed and does not include an aperture in this example.

The arrangement of the electromechanical component 20 in the cavity 12 makes it possible to have an important volume rear chamber in which the membrane 21 is intended to oscillate. The arrangement of the electromechanical component 20 is provided preferably so as to have a low volume between the front face of the membrane 21 and the lower face 5 of the substrate 1. If necessary, the electromechanical component 20 can project from the lower face of the substrate 1.

In this exemplary embodiment, the electromechanical component 20 is electrically connected to the assembling substrate 1 through at least one conducting wire 27 which passes through the hole 13. The conducting wire 27 is curved and connects a conducting zone 22 located at the front face 23 of the MEMS and/or NEMS component 20 to a conducting zone 14 of the upper face 3 of the substrate 1. To make it possible to electrically connect a conducting zone 16 located on the lower face 5 of the substrate 1 to the conducting zone 14 located on the side of its upper face 3, the substrate 1 can be provided with at least one through conducting element 17, also called a "via", which extends in the thickness of the substrate 1. In order to facilitate a possible transfer and a connection of the system to another device such as an application electronic board, one or more conducting balls 19 or solder balls can be disposed on the lower face 5 of the substrate 1, and in particular on the conducting zones 16, for example in the form of pads.

Figure 2:
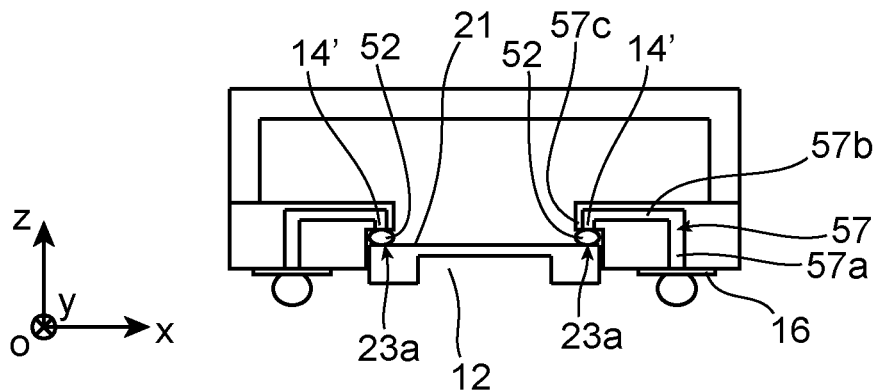
FIG. 2 illustrates another exemplary implementation of the system with a connection structure with a compact arrangement between the electromechanical component and the lower face of the assembling substrate.

An alternative arrangement illustrated in FIG. 2 provides an interconnection structure between the substrate 1 and an electromechanical component 20 which is more robust and with a reduced bulk. In this example, the interconnection structure between the electromechanical component 20 and the substrate 1 extends essentially in the thickness of the substrate 1 and enables the lower face 5 of the substrate 1 to be electrically connected to the front face 23 of the electromechanical component 20.

A region 23a located at the periphery of the front face of the MEMS component 20 is conducting, and is connected, through a conducting ball 52 to a conducting zone 14' of the substrate 1 located at the bottom of the cavity 12 at the shoulder.

To electrically connect the MEMS component 20 to a conducting zone 16 located on the lower face 5 of the substrate 1, a through conducting element 57 is provided in the thickness of the substrate 1. This conducting element 57 includes a first conducting portion 57a which extends from the connection zone 16 in a first direction making a non-zero angle with the main plane of the substrate 1, the first direction being typically orthogonal to the main plane of the substrate 1. The first conducting portion 57a is connected to a second conducting portion 57b which extends in a second direction, typically parallel to the main plane of the substrate 1. The portions 57a, 57b thus form an angle or a bend. The second conducting portion 57b extends to the hole 13 and can be connected to a third conducting portion 57c which extends towards the bottom of the cavity 12 up to the conducting zone 14' located at the shoulder. In the particular example of FIG. 2, the conducting element 57 thus has a curved shape, in particular a U shape.

Alternatively to the example just described, a conducting portion flush with the shoulder with a conducting element which snugly fits a side edge of the MEMS component 20 and thereby forms an L can be also contemplated.

In either of the examples just described, the electromechanical component 20 can be provided with integrated signal processing means. By "signal processing", it is meant at least one function of amplifying and/or filtering, and/or shaping signals. Therefore, there are on a same support a structure with an electromechanical, in particular electroacoustic transducer, and another structure with means for processing signals resulting from vibrating the membrane 21 of the electromechanical component 20.

Alternatively, the signal processing means are integrated in a support distinct from the MEMS and/or NEMS component 20, in particular an electronic component 30, such as a chip or an ASIC. Therefore, there is a transducer structure on a first support and another structure including signal processing means on a second support different from the first support.

Figure 3:
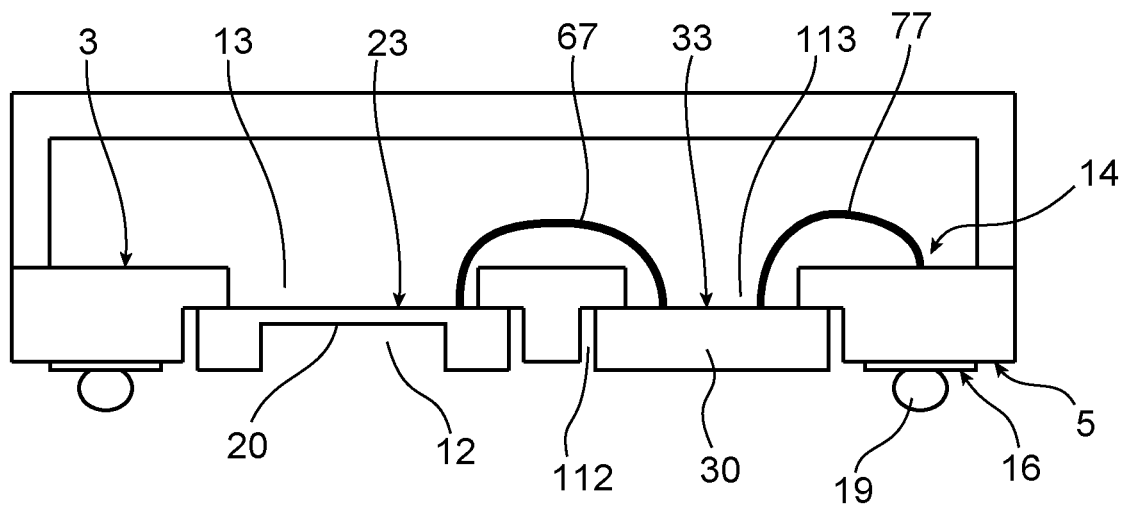
FIG. 3 illustrates another exemplary implementation of the system with an electronic component provided with means for processing signals from the MEMS and/or NEMS component, this electronic component being housed in a cavity of the substrate distinct from that in which the electromechanical component is.

In the exemplary arrangement illustrated in FIG. 3, the electronic component 30 is disposed in a second cavity 112 provided at the lower face 5 of the substrate 1 and which is separated from the cavity 12 in which the MEMS component 20 is housed. By this arrangement, a greater rear chamber volume is obtained.

In the extension of the second cavity 112, a second hole 113 opening at an upper face 3 of the substrate 1, that is the face opposite to the lower face 5, is provided. The cavity 112 is also provided with a width higher than that of the second hole 113 so as to form a shoulder.

A region of the component 30 bears against a bearing zone 115 of the substrate 1 located at the bottom of the cavity 112 and forming a shoulder. This bearing zone 115 is located in a plane P' located at the interface between the second hole 113 and the second cavity 112. In this particular example, the bearing zone 115 is parallel to the main plane of the substrate 1.

The electromechanical component 20 and the electronic component 30 are connected to each other through a conducting element. The conducting element is typically a bent shaped conducting wire 67 which extends in the closed enclosure and passes through the hole 13 formed in the substrate 1. The conducting wire 67 extends to the second hole 113 arranged in the substrate 1 and which is located in the extension of the second cavity 112 for accommodating the electronic component 30. The conducting wire 67 thus connects the front face 23 of the electromechanical component 20 and the front face 33 of the electronic component 30. To enable the electronic component 30 and indirectly the electromechanical component 20 to be connected to the substrate 1, another bent shaped conducting wire 77 extends from the front face 33 of the electronic component 30 to a conducting zone 14 located on the upper face 3 of the substrate 1.

This conducting zone 14 can itself be electrically connected to a conducting zone 16 located at the lower face of the substrate 1 for example through a through via (not represented in FIG. 3 but which can be of the type of that with reference 17 in FIG. 1).

An alternative to the arrangement previously described provides an electric contact at the rear face 35 (i.e. a face opposite to the front face 33) of the electronic component 30 located on the side of the lower face 5 of the substrate 1.

Thus, one or more conducting zones typically in the form of conducting balls 89a, 89b are disposed at the rear face 35 of the electronic component 30 to allow a connection and a possible assembly, for example with an electronic board for being disposed on the lower face 5 of the substrate 1. To allow a connection between a conducting zone 89a, 89b disposed at the rear face of the electronic component 30 and an element located at the front face of this component 30, conducting elements 87 passing through the thickness of the component 30, for example in the form of TSVs ("through silicon via") can be provided.

Figure 4:
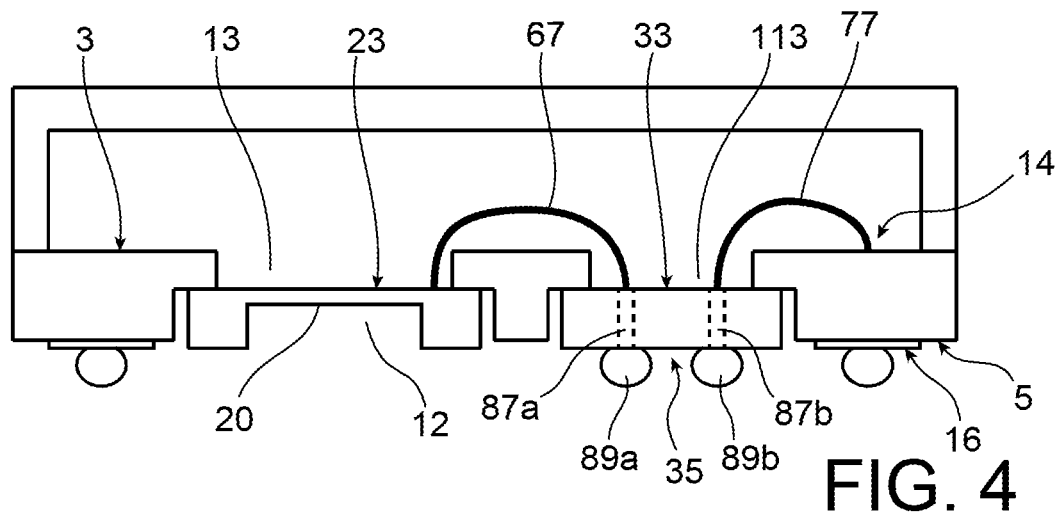
FIG. 4 illustrates an alternative implementation for which the electronic component is provided with through vias to allow contact at its rear face located on the side of the lower face of the substrate.

In the particular exemplary embodiment illustrated in FIG. 4, the conducting wire 67 connecting the MEMS and/or NEMS component 20 with the electronic component 30 is itself connected to the rear face of the electronic component 30 through a through conducting element 87a. The conducting wire 77 connecting the electronic component 30 and the substrate 1 can be itself connected to the rear face 35 of the electronic component 30 through another through conducting element 87b.

In the exemplary embodiments just described, the input port for acoustic waves is located on the side of the lower face 5 of the substrate 1. According to an alternative arrangement, an input port for the acoustic waves can be provided at the cap 40. The cap 40 thereby includes at least one aperture 43, whereas the rear face 5 of the substrate 1 can be closed.

Figure 5:
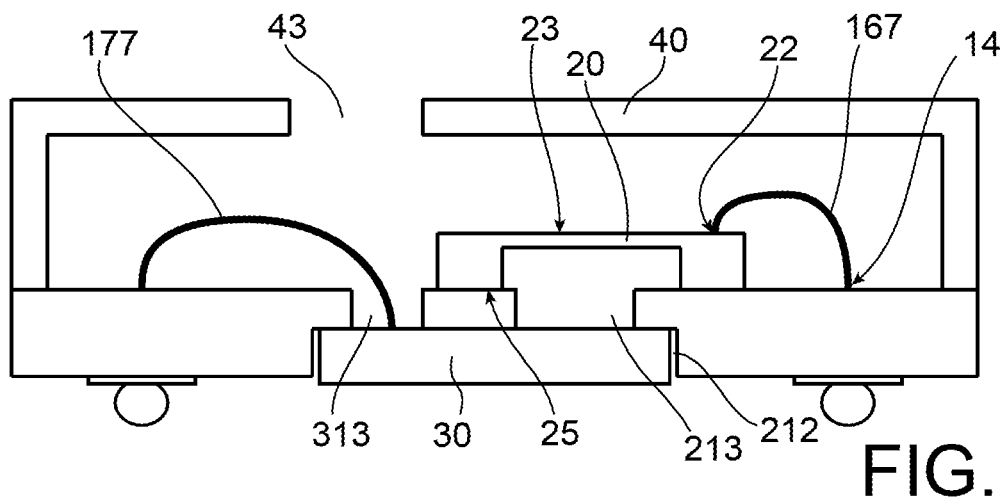
FIG. 5 illustrates another exemplary implementation of the electromechanical system in which the rear chamber extends in a hole provided in the substrate and located between the electromechanical component and the electronic component, the latter being disposed in a cavity located on the side of the lower face of the substrate.

Such a configuration type is illustrated in the particular exemplary embodiment of FIG. 5, in which the electromechanical component 20 is this time disposed on the upper face 3 of the substrate 1, the membrane 21 being suspended above and remotely from the upper face 3 of the substrate 1.

The electronic component 30 is in turn housed in a cavity 212 of the substrate 1 in the extension of which holes 213, 313 are provided. A hole 313 is used for one or more conducting wires 177 to pass therethrough to allow a connection of the electronic component 30 with the substrate 1. The membrane 21 of the electromechanical component 20 extends facing another hole 213 separated from the hole 313 by a substrate portion. This other hole 213 forms in this example a part of the rear chamber of the microphone. The electronic component 30 can be arranged so as to seal the holes 213, 313 on the side of the lower face of the substrate 1, wherein the enclosure can only be open on the side of the aperture 43 provided in the cap.

In this configuration, the substrate 1 and the electromechanical component 20 are connected through a conducting element such as a curved conducting wire 167 connecting a conducting zone 22 located at the front face 23 of the MEMS and/or NEMS component and a conducting zone 14 of the upper face 3 of the substrate 1. To allow connection of a conducting zone 16 located on the lower face 5 to the conducting zone 14 located on the side of its upper face 3, the substrate 1 can be provided with at least one through conducting element which connects the upper face 3 and the lower face 5 of the substrate 1. It can also be foreseen to establish a conducting micro-wiring for allowing connection of the electronic component 30 to the MEMS component 20.

Figure 6:
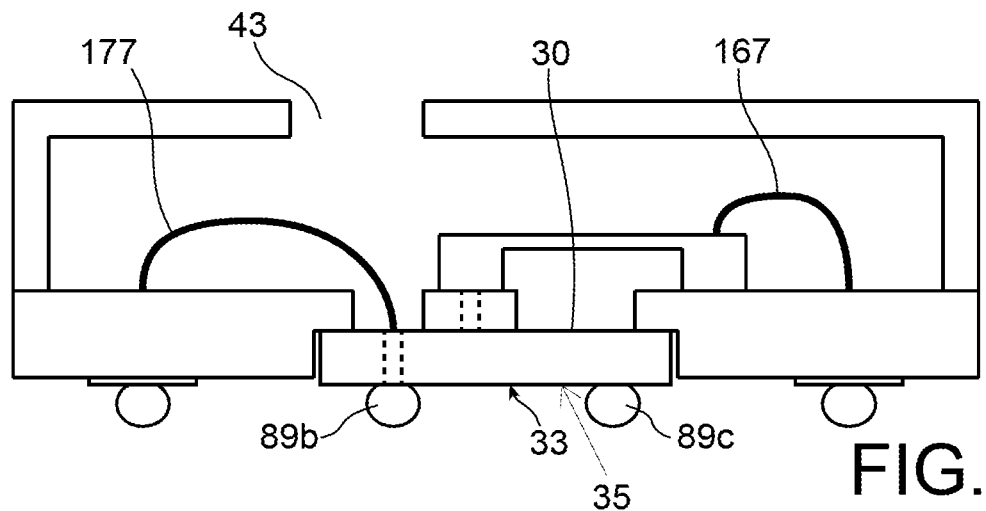
FIG. 6 illustrates an alternative arrangement of the electromechanical system in which the electronic component is provided with conducting balls at the rear face thereof.

A similar arrangement is illustrated in FIG. 6 with this time, conducting balls 89b, 89c to make it possible to establish contact at the rear face 35 of the electronic component 30 and a possible assembly with another device, in particular an electronic board.

Figure 7:
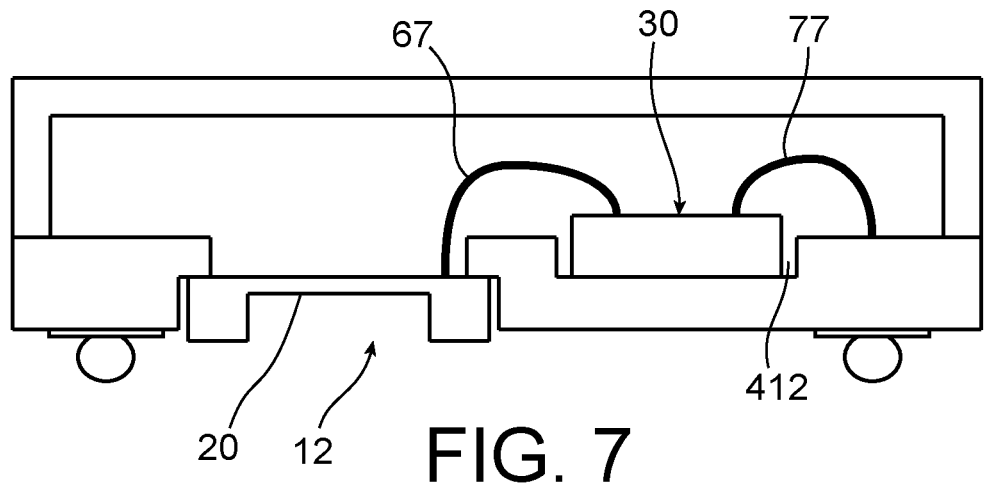
FIG. 7 illustrates another exemplary implementation of the electromechanical system in which the electromechanical component is disposed in a cavity located on the side of the lower face of the substrate whereas the electronic component is arranged in a cavity located on the side of the upper face of the substrate.

Another exemplary configuration making it possible to obtain a reduced bulk and a a large rear volume is illustrated in FIG. 7. As in the previously described examples in connection with FIGS. 3 and 4, the system includes an input port located on the side of the lower face 5 of the substrate 1. The electronic component 30 is this time disposed in a cavity 412 located on the side of the upper face 3 of the substrate 1. The respective cavities 12, 412 of the MEMS component 20 and the electronic component 30 are distinct and do not communicate with each other.

Figure 8:
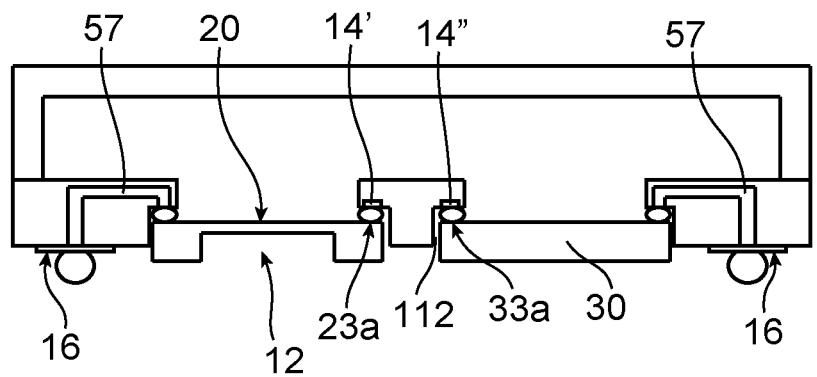
FIG. 8 illustrates another exemplary implementation of the electromechanical system in which the electromechanical component and the electronic component are respectively arranged in a cavity and in another cavity located on the side of the lower face of the substrate, these components being connected to the substrate through a connection of the type of those of the embodiment of FIG. 2.

In the exemplary arrangement illustrated in FIG. 8, the MEMS component 20 is arranged in the cavity 12 located at the lower face 5 of the substrate 1 whereas the electronic component 30 is disposed in another cavity 112 provided at the lower face 5. This arrangement differs from that previously described in connection with FIG. 3 or FIG. 4, in particular in that the electromechanical component 20 and the electronic component 30 are connected to the substrate through conducting elements 57 passing through the substrate. These conducting elements 57 are of the type of those previously described in connection with FIG. 2. The conducting elements 57 extend in the substrate 1 and open at its lower face 5 on conducting zones 16.

As in the exemplary embodiment of FIG. 2, a region 23a located at the periphery of the front face of the MEMS component 20 is conducting, and is connected, through a conducting zone to a conducting zone 14' of the substrate 1 located at the bottom of the cavity 12 at the shoulder. Likewise, at the periphery of the front face of the electronic component 30, that includes a conducting zone 33a which is connected to a conducting zone 14" of the substrate 1 located at the bottom of the cavity 12 at the shoulder of the cavity 112.

One example of method for manufacturing an electromechanical system forming a microphone will now be described in connection with FIGS. 9A-9E.

Figure 9A:
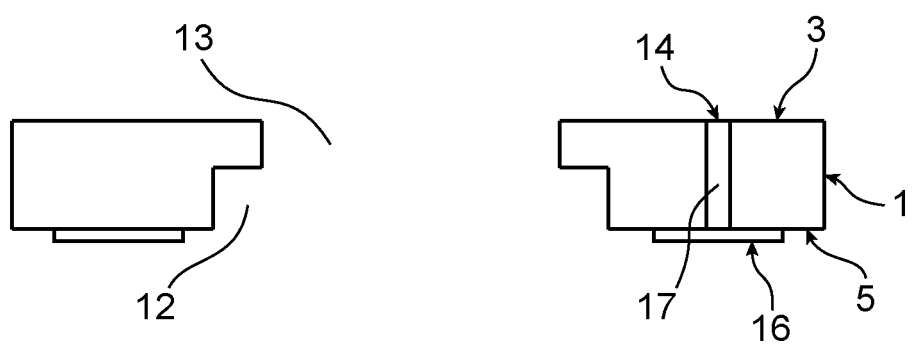
FIGS. 9A-9E illustrate an exemplary method for manufacturing a pressure sensor electromechanical system implemented according to one embodiment of the present invention.

A possible starting structure of the method is illustrated in FIG. 9A in the form of a substrate 1 which can be for example a PCB ("Printed Circuit Board"). At its lower face 5, the substrate 1 includes at least one cavity 12 and a hole 13 communicating with the cavity 12, the hole 13 with a width lever smaller than that of the cavity 12 opening at the upper face 3 of the substrate 1. The starting substrate 1 also includes one or more conducting zones 14 on its upper face 3 as well as one or more conducting zones 16 located on its lower face 5, a conducting zone 14 being typically connected to a conducting zone 16 through via 17.

Figure 9B:
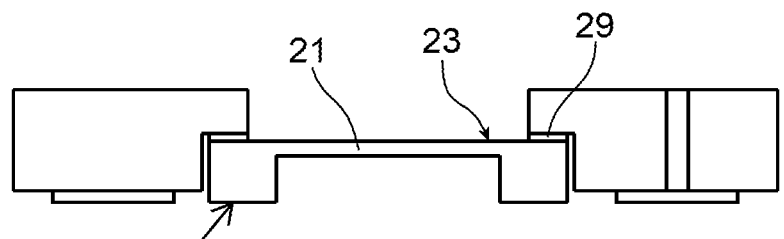

FIG. 9B then illustrates a step of transferring an electromechanical component 20 in the cavity 12, the component being provided with a suspended structure such as a membrane 21. The transfer is typically made using an adhesive 29 such that a region of the front face 23 of the electromechanical component 20 is placed against a zone of the substrate 1 forming a step or a shoulder. The dimensions of the cavity 12 in a plane parallel to the main plane of the substrate 1 are contemplated as being greater than the dimensions of the electromechanical component 20 in order to house or press-fit this component 20 in the cavity and make assembly easier.

Figure 9C:
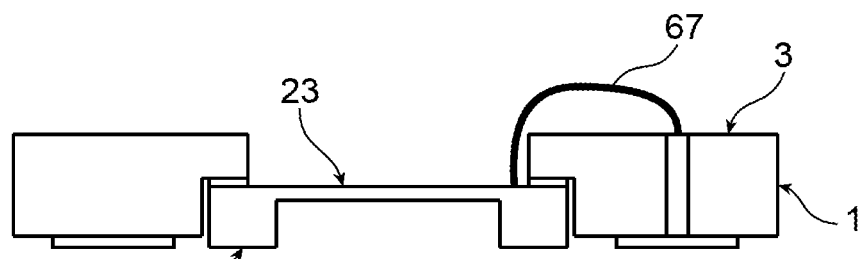

Then, in FIG. 9C, a connection is made between the electromechanical component 20 and the substrate 1. A wire bonding method can be implemented in order to make a conducting wire 67 connecting the front face 23 of the electromechanical component 20 and the upper face 3 of the substrate 1 substantially parallel but located at different levels from each other.

Figure 9D:
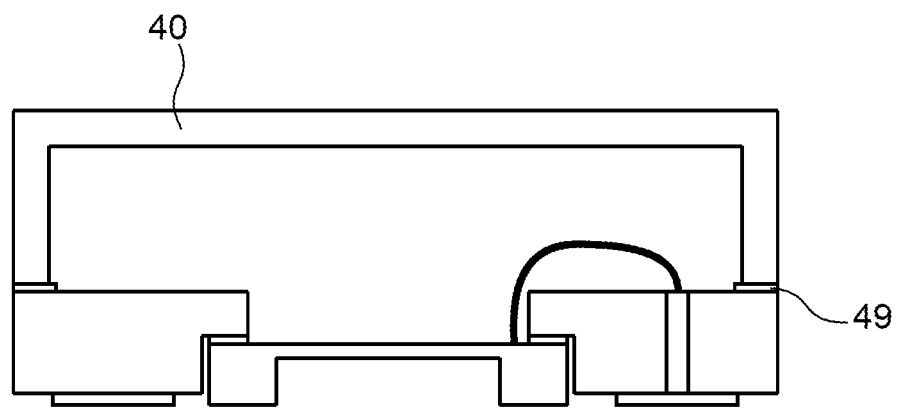

A cap 40 is then transferred to the front face 3 of the substrate 1, as is illustrated in FIG. 9D. The cap 40 is disposed on the substrate 1 such that it forms a protective enclosure on top of the electromechanical component 20.

Assembling the cap 40 with the substrate 1 is typically made using an adhesive 49 which can be a conducting adhesive, in particular when the cap 40 is metallic.

Figure 9E:
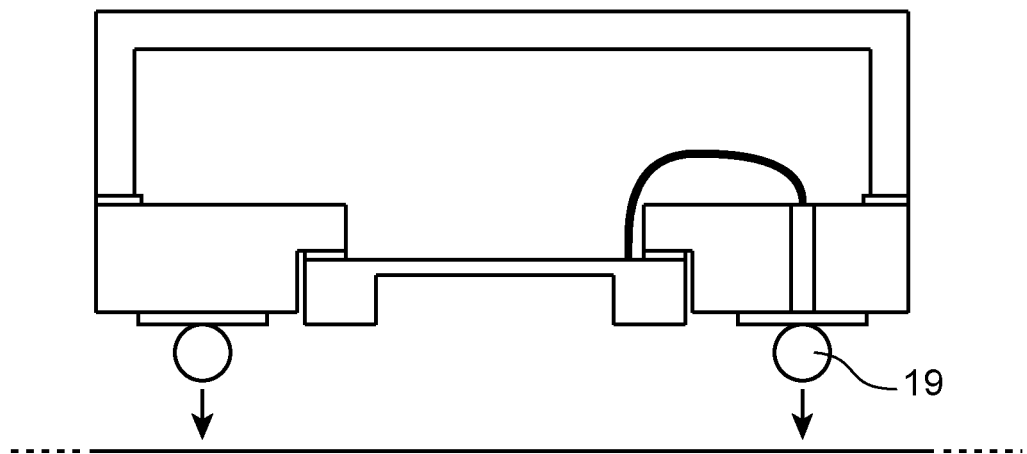

Optionally, one or more conducting balls 19 can be disposed on the lower face 5 of the substrate 1. Such conducting balls 19 can be in the form of solder balls to allow a possible transfer of the system to another support such as an application electronic board C (FIG. 9E).

A microphone such as previously described finds applications in many fields and can be integrated for example to a communication device such as a mobile phone or a computing device such as a tablet computer. According to other examples, a system according to either of the embodiments previously described can be integrated in an automobile vehicle or a medical device in particular a hearing aid.

The invention claimed is:

1. A pressure sensor electromechanical system comprising:
   a first structure including an electromechanical transducer provided with a sensitive element able to be moved under the effect of a pressure difference between its faces,
   a second structure including a signal processing electronic component, processing the signals resulting from a movement of said sensitive element,
   a substrate for accommodating the first and second structures, the substrate including an upper face and a lower face opposite to the upper face, the first structure and the second structure being disposed in one or more cavity(ies) formed in the substrate and each opening into at least one of the faces of the substrate, the lower face being provided with at least one connection conducting zone,
   a first cavity among said cavities in which the first structure is disposed opening into the lower face of the substrate, said first cavity communicating with a first hole passing through the substrate between said first cavity and the upper face of the substrate, the cavity having a width greater than that of said first hole so as to form a shoulder, a front face of the first structure bearing against a bearing zone of the shoulder located in a plane of interface between the cavity and the first hole, and
   a protective cap arranged on the upper face of the substrate.

2. The electromechanical system according to claim 1, the protective cap being metallic.

3. The system according to claim 1, comprising a connection structure between said conducting zone located on the lower face of the substrate and a conducting zone of the first structure, the connection structure comprising at least one conducting element passing through the substrate.

4. The electromechanical system according to claim 3, wherein the connection structure comprises at least one conducting wire passing through the first hole and connecting a conducting zone located on the upper face of the substrate and the conducting zone of the first structure.

5. The electromechanical system according to claim 3, wherein the conducting element passing through the substrate has a curved shape, the conducting element being arranged so as to connect the bearing zone of the shoulder and said conducting zone located on the lower face of the substrate.

6. The electromechanical system according to claim 1, wherein the first structure and the second structure are integrated to a same support.

7. The electromechanical system according to claim 1, wherein the first structure is integrated to a first support, the second structure is integrated to a second support distinct from the first support, the second support being disposed in a second cavity opening at, the lower face of the substrate, the second cavity communicating with a second hole, the second hole having a width smaller than that of the second cavity and opening at the upper face of the substrate.

8. The electromechanical system according to claim 7, wherein the first support is connected to a front face of the second support through at least one conducting wire passing through the first hole, the second support being connected to the substrate through at least one other conducting wire.

9. The electromechanical system according to claim 8, the conducting wire and/or the other conducting wire being connected to an element passing through the second support.

10. The electromechanical system according to claim 8, the conducting wire and/or the other conducting wire being connected to an element passing through the second support.

11. The electromechanical system according to claim 1, wherein the first structure is integrated to the first support, the second structure is integrated to a second support, distinct from the first support, the second support being disposed in another cavity distinct from the first cavity, the other cavity opening at the upper face of the substrate.

12. The electromechanical system according to claim 11, wherein the first support is connected to a front face of the second support through at least one conducting wire passing through the first hole, the second support being connected to the substrate through at least one other conducting wire.

13. The electromechanical system according to claim 1, wherein the first cavity forms an input port for acoustic waves.

14. The electromechanical system according to claim 1, wherein the substrate is based on a polymeric or ceramic material.

15. A method for making a system according to claim 1, wherein the first structure is integrated to a first support, the method comprising assembling the first support in the cavity, the first structure and the substrate being in particular assembled by adhering or welding in the cavity.

16. A pressure sensor electromechanical system comprising:
a first structure including an electromechanical transducer provided with a sensitive element able to be moved under the effect of a pressure difference between its faces,
a second structure including a signal processing electronic component, processing the signals resulting from a movement of said sensitive element,
a substrate for accommodating the first and second structures, the substrate including an upper face and a lower face opposite to the upper face, the first structure and the second structure being disposed in one or more cavity(ies) formed in the substrate and each opening into at least one of the faces of the substrate, the lower face being provided with at least one connection conducting zone,
a first cavity among said cavities in which the first structure is disposed opening into the lower face of the substrate, said first cavity communicating with a first hole passing through the substrate between said first cavity and the upper face of the substrate, the cavity having a width greater than that of said first hole so as to form a shoulder, a front face of the first structure bearing against a bearing zone of the shoulder located in a plane of interface between the cavity and the first hole,
wherein the sensitive element is disposed on the side of the front face of the first structure.

17. A pressure sensor electromechanical system comprising:
a first structure including an electromechanical transducer provided with a sensitive element able to be moved under the effect of a pressure difference between its faces,
a second structure including a signal processing electronic component, processing the signals resulting from a movement of said sensitive element,
a substrate for accommodating the first and second structures, the substrate including an upper face and a lower face opposite to the upper face, the first structure and the second structure being disposed in one or more cavity(ies) formed in the substrate and each opening into at least one of the faces of the substrate, the lower face being provided with at least one connection conducting zone,
a first cavity among said cavities in which the first structure is disposed opening into the lower face of the substrate, said first cavity communicating with a first hole passing through the substrate between said first cavity and the upper face of the substrate, the cavity having a width greater than that of said first hole so as to form a shoulder, a front face of the first structure bearing against a bearing zone of the shoulder located in a plane of interface between the cavity and the first hole, and, comprising a connection structure between said conducting zone located on the lower face of the substrate and a conducting zone of the first structure, the connection structure comprising at least one conducting element passing through the substrate.

* * * * *